(12) United States Patent
Komori et al.

(10) Patent No.: US 12,501,595 B2
(45) Date of Patent: Dec. 16, 2025

(54) ELECTRONIC APPARATUS AND ELECTRO-MAGNETIC INTERFERENCE REDUCTION METHOD

(71) Applicant: Hitachi, Ltd., Tokyo (JP)

(72) Inventors: Takemasa Komori, Tokyo (JP); Masao Ogihara, Tokyo (JP)

(73) Assignee: HITACHI SOLUTIONS, LTD., Tokyo (JP)

( * ) Notice: Subject to any disclaimer, the term of this patent is extended or adjusted under 35 U.S.C. 154(b) by 178 days.

(21) Appl. No.: 18/469,011

(22) Filed: Sep. 18, 2023

(65) Prior Publication Data
US 2024/0381600 A1  Nov. 14, 2024

(30) Foreign Application Priority Data
May 8, 2023 (JP) ................................. 2023-076504

(51) Int. Cl.
*H05K 9/00* (2006.01)

(52) U.S. Cl.
CPC ................................. *H05K 9/0081* (2013.01)

(58) Field of Classification Search
None
See application file for complete search history.

(56) References Cited

FOREIGN PATENT DOCUMENTS

| JP | 2000-013087 A | | 1/2000 |
|---|---|---|---|
| JP | 2004177198 A | * | 6/2004 |
| JP | 2005033404 A | * | 2/2005 |
| JP | 2017-028042 A | | 2/2017 |
| JP | 2020105959 A | * | 7/2020 |

\* cited by examiner

*Primary Examiner* — Kenneth Bukowski
(74) *Attorney, Agent, or Firm* — Volpe Koenig (57) ABSTRACT

An electronic device (communication device) including a reflecting member having a reflecting surface that causes electro-magnetic waves emanating from a predetermined part of the electronic device in a predetermined radiating direction to be reflected in a direction other than the radiating direction.

16 Claims, 6 Drawing Sheets

RATIO OF ELECTRIC FIELD INTENSITY TO PULL-OUT LENGTH L AT
FREQUENCY OF 8 GHz AND AT BENDING ANGLE θ OF 45 DEGREES

FIG. 10

RATIO OF ELECTRIC FIELD INTENSITY TO PULL-OUT LENGTH L AT
FREQUENCY OF 16 GHz AND AT BENDING ANGLE θ OF 45 DEGREES

FIG. 11

DEPENDENCE OF ELECTRIC FIELD INTENSITY RATIO ON BENDING ANGLE θ
AT FREQUENCY OF 8 GHz OVER PULL-OUT LENGTH L OF 40 mm

ELECTRONIC APPARATUS AND ELECTRO-MAGNETIC INTERFERENCE REDUCTION METHOD

CROSS-REFERENCE TO RELATED APPLICATION

The present application claims priority pursuant to 35 U.S.C. § 119 to Japanese Patent Application No. 2023-076504 filed on May 8, 2023, the entire disclosure of which is hereby incorporated herein by reference.

BACKGROUND OF THE INVENTION

1. Field of the Invention

The present invention relates to an electronic device and an electro-magnetic interference reduction method.

2. Description of the Related Art

Electro-magnetic waves emanating from electronic products can adversely affect the operation of other products. It is thus preferred that such electro-magnetic interference (EMI) be reduced. For that purpose, regulations regarding EMI have been established. There are cases in which tests (EMI tests) are carried out to see whether the regulations are met. The EMI tests involve, for example, determining whether predetermined reference values are not exceeded by the electro-magnetic waves of a predetermined frequency observed in all directions (rotation angles) of a target electronic product at a predetermined height (an assumed position of another product liable to be affected by the electro-magnetic waves) separated from the target electronic product by a predetermined distance.

Various EMI countermeasures have been proposed for integrated circuits (IC) or substrates of electronic products, which are typical sources of EMI. Representative countermeasures include use of metallic electro-magnetic shields, use of electro-magnetic wave absorption sheets, and adoption of a technique for reducing the amount of interfering electro-magnetic waves at a peak frequency through frequency modulation using a spread spectrum clock (SSC), for example. These countermeasures constitute an approach to contain or prevent the interfering electro-magnetic waves from radiating externally. An example of this approach, disclosed in Japanese Patent Application Publication No. 2000-13087, is a low-EMI structure for reducing the electro-magnetic wave noise generated by an electro-magnetic wave noise source. The disclosed low-EMI structure has a ferroelectric material with a flat surface facing the electro-magnetic wave noise source. The ferroelectric material is placed in a predetermined position relative to the electro-magnetic wave noise source and the electro-magnetic wave noise from the electro-magnetic wave noise source is directed in a direction normal to the ferroelectric material.

SUMMARY OF THE INVENTION

In the case of the technique for containing interfering electro-magnetic waves, however, the electro-magnetic waves at high frequencies of several gigahertz (GHz) or higher (short wavelengths) can leak through a clearance or small gap as narrow as a few centimeters (cm) between components. Forming an enclosure in a manner preventing such leaks can complicate shapes of metal (plates) involved and lead to increased costs of metallic molds or electro-magnetic wave absorption sheets. Meanwhile, in the case of the SSC technique for preventing interfering electro-magnetic waves from radiating externally, an error rate involved may worsen due to the nature of high-speed SSC signal transmission. In a worst-case situation, some ICs are incapable of transmitting data normally or maintaining a link-up status.

In particular, many storage or server equipments are configured to supplement a main substrate carrying a central processing unit (CPU) and other key components with external input/output (I/O) modules having communication functions, with a view to improving maintainability or increasing the degree of flexibility of configuration. These I/O modules, concentrated in a certain area when mounted on the main substrate, are liable to become a source of breaching EMI-related standards. Notably in recent years, the I/O modules have tended to handle frequencies higher than those of the electro-magnetic waves corresponding to their fundamental frequency in order to support still-higher transmission rates. In this respect, the EMI countermeasures are that much more difficult to implement.

Furthermore, the storage and server equipments have a complex component configuration under standard or technical constraints. That means that it is difficult to perform prevalidation by simulating EMI. Confirmation is difficult to execute until the last stage of development is reached (it being too complicated to carry out simulations with the entire equipment).

The present invention was conceived in view of the above circumstances and aims to provide an electronic device and an electro-magnetic interference reduction method for reducing electro-magnetic interference easily and effectively.

In solving the foregoing and other problems of the related art and according to one aspect of the invention, there is provided an electronic device including a reflecting member having a reflecting surface that causes electro-magnetic waves emanating from a predetermined part of the electronic device in a predetermined radiating direction to be reflected in a direction other than the radiating direction.

The present invention thus makes it possible to reduce electro-magnetic interference easily and effectively.

The foregoing and other objects, features, and advantages of the present invention will become evident from the following detailed description of a preferred embodiment taken in conjunction with the appended drawings.

DESCRIPTION OF THE PREFERRED EMBODIMENT

A preferred embodiment of the present invention is described below with reference to the accompanying drawings.

Figure 1:
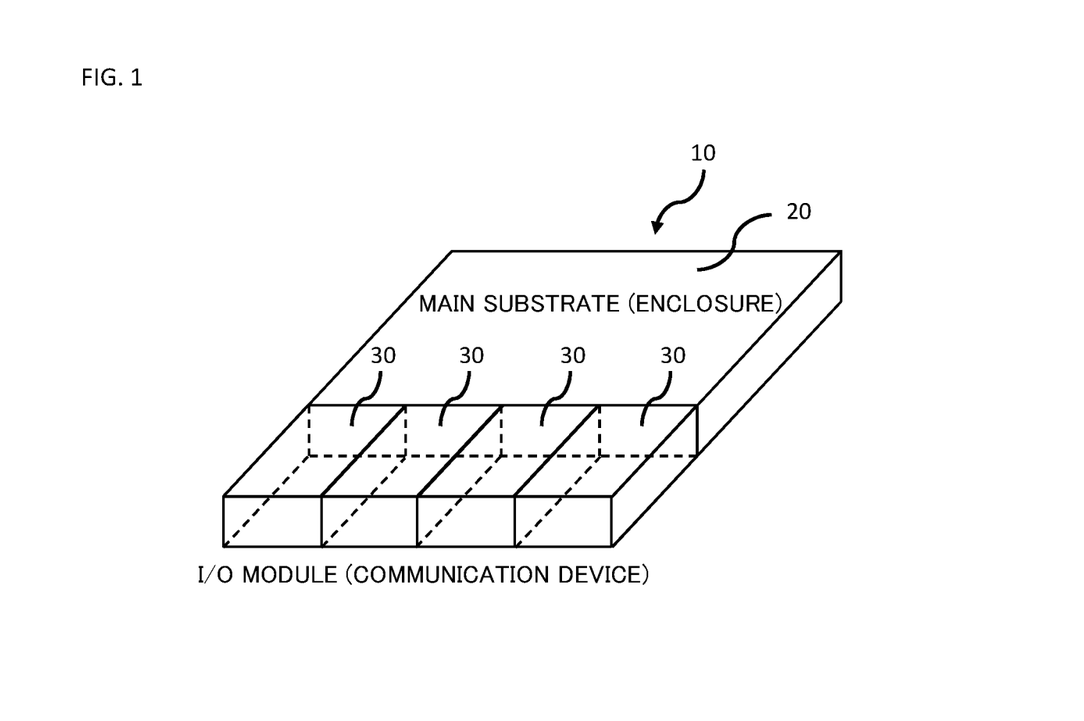
FIG. 1 is a perspective view illustrating an overall structure of a substrate system equipped with a communication device according to an embodiment of the present invention.

FIG. 1 is a perspective view illustrating an overall configuration of a substrate system 10 equipped with communication devices 30 each being an electronic device according to the present embodiment. As depicted in FIG. 1, the substrate system 10 is configured to include a main substrate 20 and the communication devices 30 inserted into the main substrate 20.

The main substrate 20 may be a circuit board (printed-circuit board), for example, with various elements (circuits) mounted on a substantially planer base material. The main substrate 20 is configured, for example, with an insulating material such as epoxy resin or phenol resin as the base material and with conductors such as copper foil as a conducting material. In the present embodiment, the main substrate 20 is the substrate of an information processing equipment (computer) and carries electronic components such as a CPU and a memory. The substrate system 10 is arranged in a substantially horizontal direction at a predetermined height inside the computer, for example.

Figure 2:
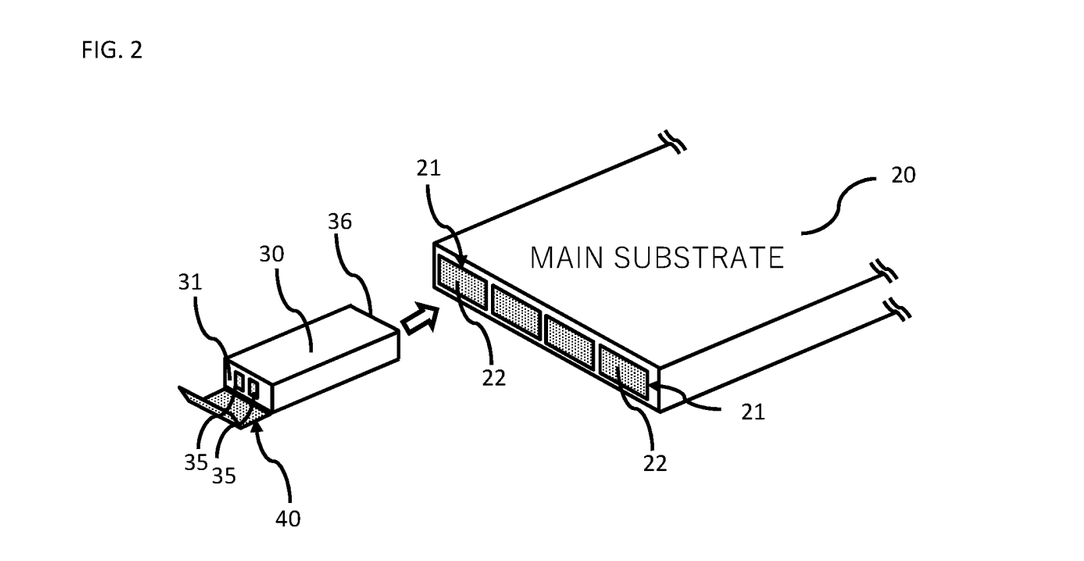
FIG. 2 is a perspective view illustrating a connection relation between a main substrate and the communication device.

FIG. 2 is a perspective view illustrating a connection relation between the main substrate 20 and the communication device 30. As depicted in FIG. 2, one or multiple slots 21 are provided at predetermined positions of the main substrate 20. The slots 21 have one or multiple substrate insertion ports 22 each having an internal space into which the communication device 30 is to be inserted. Each substrate insertion port 22 is open in a substantially horizontal direction.

When inserted into the slot 21 of the main substrate 20, the communication device 30 serves as an additional communication module (I/O module) connected (electrically) to the main substrate 20. As with the main substrate 20, the communication device 30 is an electronic device having various electronic components mounted on a predetermined base material. The communication device 30 is formed of materials similar to those of the main substrate 20.

The communication device 30 is a network card or an interface card, for example, the network card performing data communication over fiber optic channels or other communication networks at communication rates in accordance with predetermined standards, the interface card carrying out data communication with a predetermined device (e.g., storage device) at communication rates in accordance with predetermined standards.

A side surface 36 of the communication device 30 to be inserted into the slot 21 has a fitting part shaped to fit into the internal space of the slot 21. Another side surface of the communication device 30 to be exposed upon insertion into the slot 21 (referred to as the slot surface 31 hereunder) has one or more cable insertion ports 35 into which a communication cable (not depicted) for communicating with another device can be inserted.

The communication device 30 radiates externally electro-magnetic waves having a specific directivity particularly through the slot surface 31. Specifically, during operation, each communication device 30 radiates electro-magnetic waves having a unique frequency (i.e., fundamental frequency) in a direction conforming to the directivity of the device (referred to as the radiating direction hereunder).

Here, the slots 21 of the main substrate 20 are positioned close to each other by design, so that the communication devices 30 are also arranged close to each other when in place. As a result, there is a possibility that the electro-magnetic waves emanating from the communication devices 30 at frequencies high enough to exceed predetermined standards may be radiated toward the surroundings. This in turn can cause electro-magnetic interference with other products located in the radiating direction. Furthermore, in a certain EMI test, the electro-magnetic waves detected to exceed standards can cause the test subject to fail the test.

Thus, as depicted in FIG. 2, the slot surface 31 of the communication device 30 of the present embodiment has a reflecting member 40 arranged to reflect the radiated electro-magnetic waves in a manner shifting their directivity. What follows is a detailed explanation of the reflecting member 40.

Figure 3:
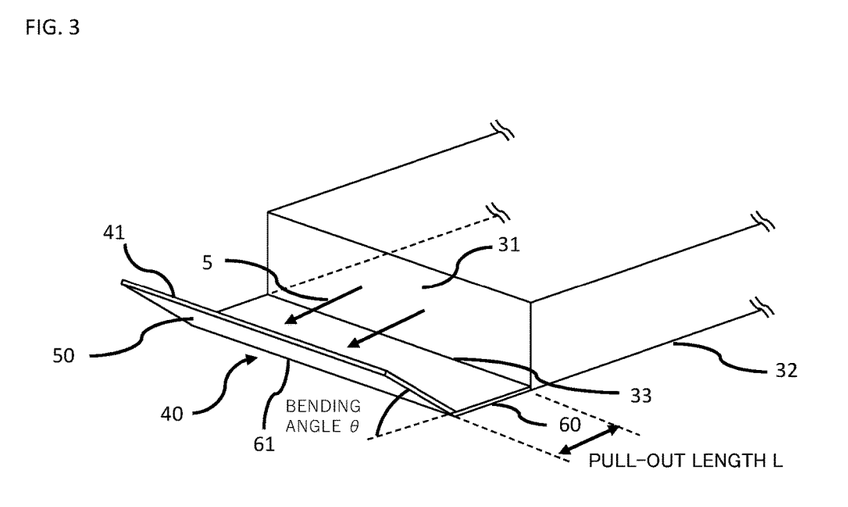
FIG. 3 is a perspective view depicting an example of the communication device according to the present embodiment.
Figure 4:
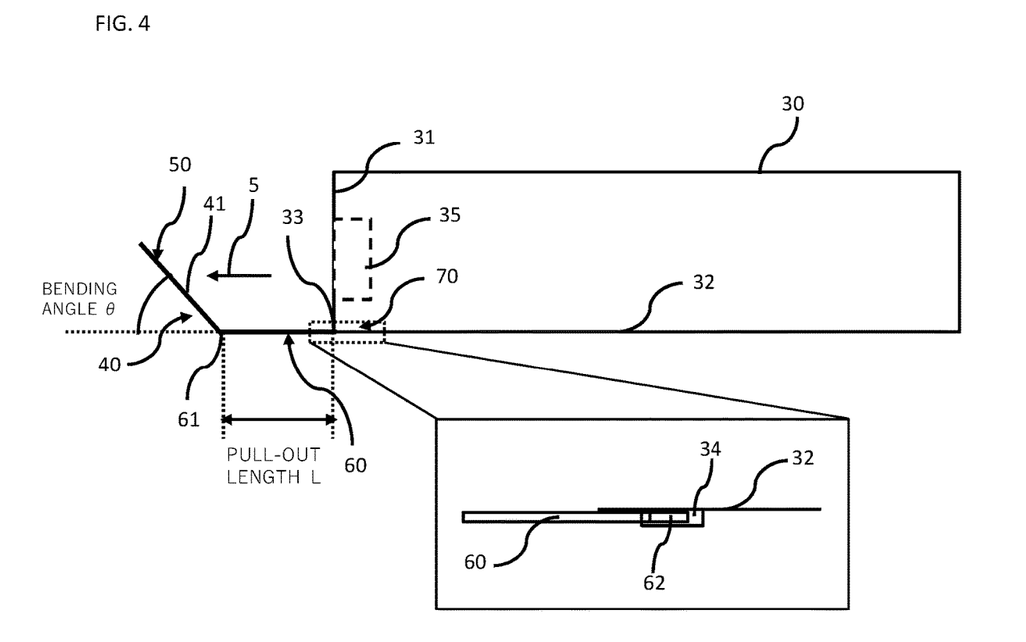
FIG. 4 is a lateral view depicting the example of the communication device according to the present embodiment.

FIG. 3 is a perspective view depicting an example of the communication device 30 according to the present embodiment. FIG. 4 is a lateral view depicting the example of the communication device 30 according to the present embodiment.

As depicted in FIGS. 3 and 4, the communication device 30 and the reflecting member 40 are detachably connected to each other via an attachment/detachment structure 70. The attachment/detachment structure 70 is, for example, configured to include an inserting portion 62 and an inserted portion 34, the inserting portion 62 (e.g., protruding portion; the hook of a hook-and-loop fastener) being at one end of a pull-out portion 60, to be discussed later, of the reflecting member 40, the inserted portion 34 (e.g., a hole structure to be mated with a protruding portion; the loop of a hook-and-loop fastener) being at a bottom surface 32 of the communication device 30.

The reflecting member 40 has a substantially planar reflecting portion 50 having a reflecting surface 41 and a substantially planar pull-out portion 60.

The pull-out portion 60 is provided to separate the reflecting surface 41 of the reflecting member 40 from the slot surface 31 of the communication device 30 by a predetermined distance. The reflecting surface 41 causes the electro-magnetic waves emanating in a radiating direction 5 from the slot surface 31 to be reflected in directions other than the radiating direction 5.

The pull-out portion 60 extends in the radiating direction 5 from the communication device 30. Specifically, the pull-out portion 60 extends in a substantially horizontal direction for a predetermined length L (referred to as the pull-out length L hereunder) from a boundary edge 33 (bottom edge) between the slot surface 31 and the bottom surface 32 of the communication device 30. Here, the pull-out length L is the distance between the boundary edge 33 of the communication device 30 as one end of the pull-out portion 60 on one hand, and a boundary edge 61 that forms a boundary between the reflecting portion 50 and the pull-out portion 60 as another end of the pull-out portion 60 on the other hand.

Here, it is preferred that the pull-out length L be between 0 mm and 50 mm, inclusive (a case where the length L is 0 mm is discussed later in detail).

The reflecting portion 50 is bent at a predetermined angle relative to the direction of extension of the pull-out portion 60. Specifically, the reflecting portion 50 is bent upward at a predetermined angle (referred to as the bending angle θ hereunder) relative to the planar direction (substantially horizontal direction) of the pull-out portion 60 at the boundary edge 61. That is, the reflecting portion 50 (reflecting surface 41) is bent at the bending angle θ relative to the planar direction of the pull-out portion 60 of the reflecting member 40.

Here, it is preferred that the bending angle θ be greater than 20 degrees and up to 80 degrees.

Of the reflecting member 40, at least the reflecting surface 41 is formed of a material that reflects electro-magnetic waves. For example, the reflecting surface 41 may be made of a good conductor such as metal. The surface of the pull-out portion 60 should also be formed preferably of a material reflecting electro-magnetic waves.

Alternative examples of the communication device 30 are described below.

Alternative Example 1

Figure 5:
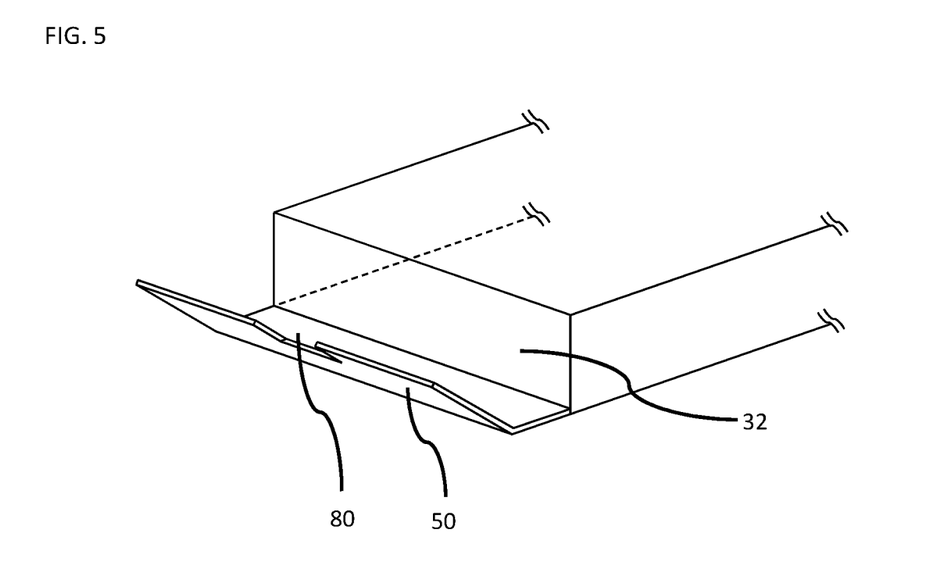
FIG. 5 is a perspective view depicting an example of the communication device having a cutaway portion on its reflecting portion.
Figure 6:
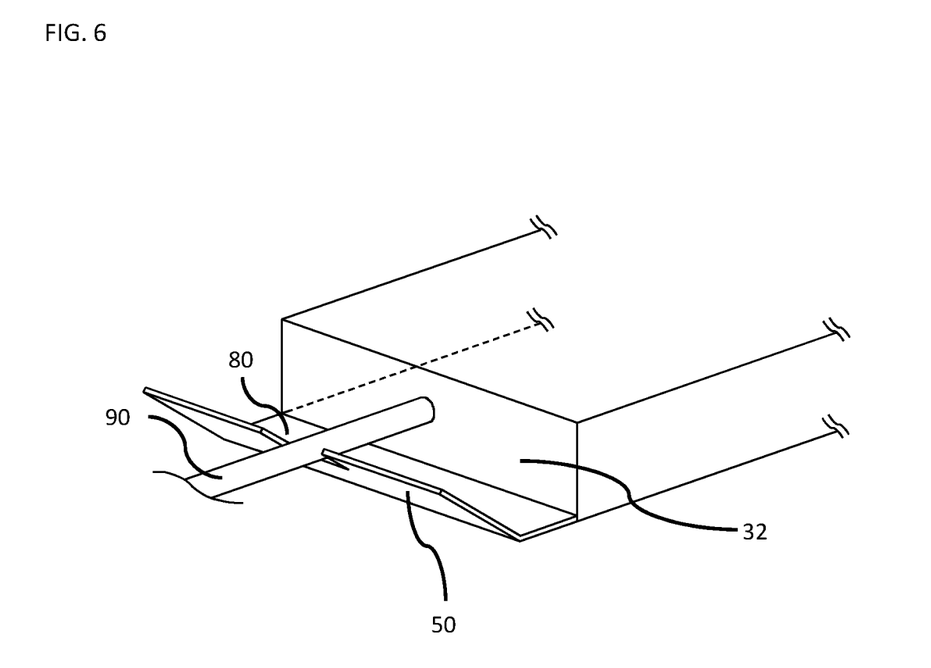
FIG. 6 is a perspective view depicting an example of the communication device having the cutaway portion on its reflecting portion with a communication cable connected to the device.

FIG. 5 is a perspective view depicting an example of the communication device 30 having a cutaway portion 80 in its reflecting portion 50. FIG. 6 is a perspective view depicting an example of the communication device 30 having the cutaway portion 80 in its reflecting portion 50 with a communication cable 90 connected to the device 30.

That is, as depicted in FIGS. 5 and 6, the cutaway portion 80 for easy attachment and detachment of the communication cable 90 is provided in a predetermined area of the reflecting portion 50.

The cutaway portion 80 is formed by being cut away from that part of the reflecting portion 50 in which to position the communication cable 90 inserted into the cable insertion port 35. For example, a cutaway or a through-hole is provided in that position of the reflecting portion 50 which is at substantially the same height as the cable insertion port 35. In the example in FIGS. 5 and 6, the cutaway portion 80 is formed at a top center of the reflecting portion 50 in a shape corresponding to the cross-sectional shape of the communication cable 90.

The above structure allows the communication cable 90 to be easily inserted into and detached from the cable insertion port 35.

Widening the cutaway portion 80 makes it easier to attach and detach the communication cable 90 but reduces the efficiency of reflecting electro-magnetic waves. In view of this, the size of the cutaway portion 80 is preferably 50 percent or less of the reflecting portion 50.

Alternative Example 2

Figure 7:
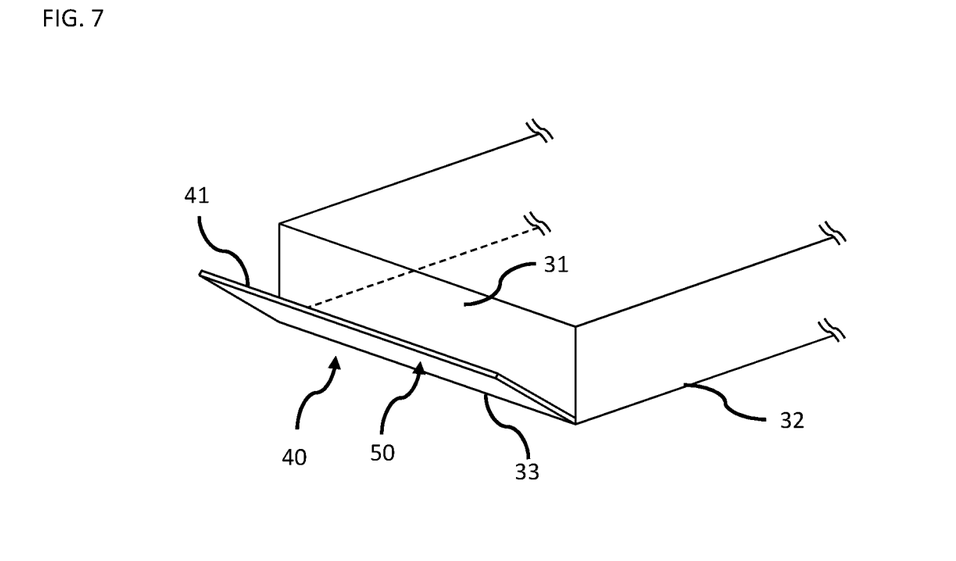
FIG. 7 is a perspective view depicting an exemplary configuration of a communication device having a reflecting member with no cutaway portion.
Figure 8:
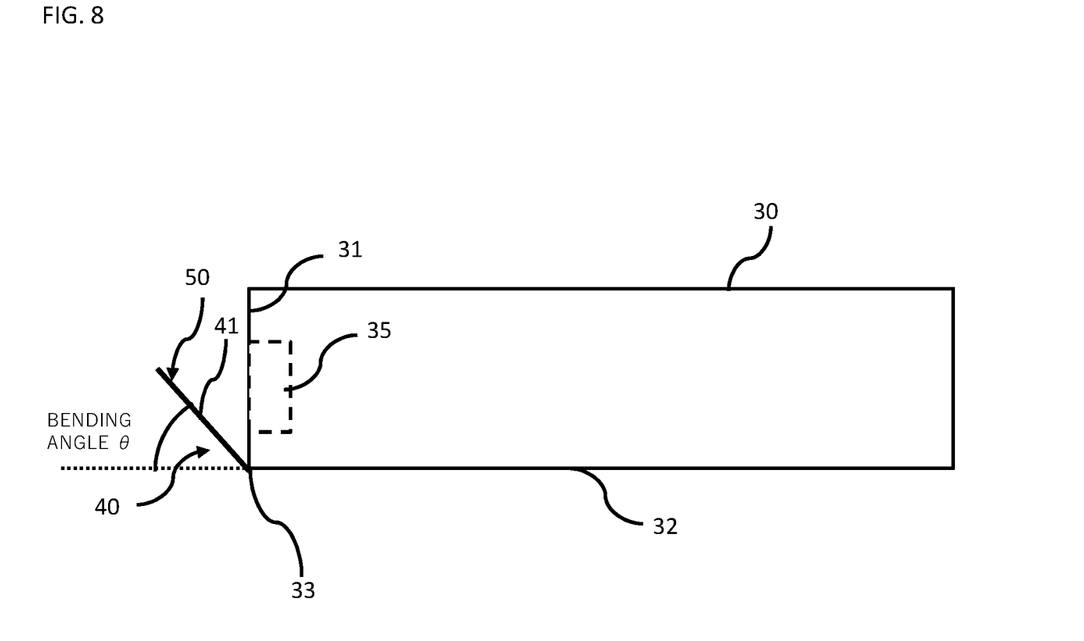
FIG. 8 is a side view depicting the exemplary configuration of the communication device having the reflecting member with no cutaway portion.

FIG. 7 is a perspective view depicting an exemplary configuration of the communication device 30 having the reflecting member 40 without the pull-out portion 60 (i.e., pull-out length L is 0 mm). FIG. 8 is a side view depicting the exemplary configuration of the communication device 30 having the reflecting member 40 without the pull-out portion 60.

As depicted in FIGS. 7 and 8, the reflecting member 40 is configured as a substantially planar member that connects directly with the slot surface 31 of the communication device 30 (specifically, with the boundary edge 33 (bottom edge) between the slot surface 31 and the bottom surface 32). As with the above-described reflecting portion 50 of the communication device 30, the reflecting member 40 in this example is bent upward at the bending angle θ relative to the direction of the bottom surface 32 of the communication device 30.

In this manner, even the configuration without the pull-out portion 60 ensures the distance between the slot surface 31 and the reflecting surface 41. Simplified processing still makes it possible to reflect the radiating electro-magnetic waves in directions other than the radiating direction. The reflecting member 40 may be connected with the communication device 30 via the above-described attachment/detachment structure. The reflecting member 40 may also be provided with the above-mentioned cutaway portion.

Confirmation by Simulation

The present inventor and others have confirmed the ability of the communication device 30 configured as discussed above to reduce electro-magnetic interference by simulation, as described below. The simulations were carried out using CST Studio Suite 2022 electromagnetic field simulation software (from Dassault Systèmes K. K.).

Figure 9:
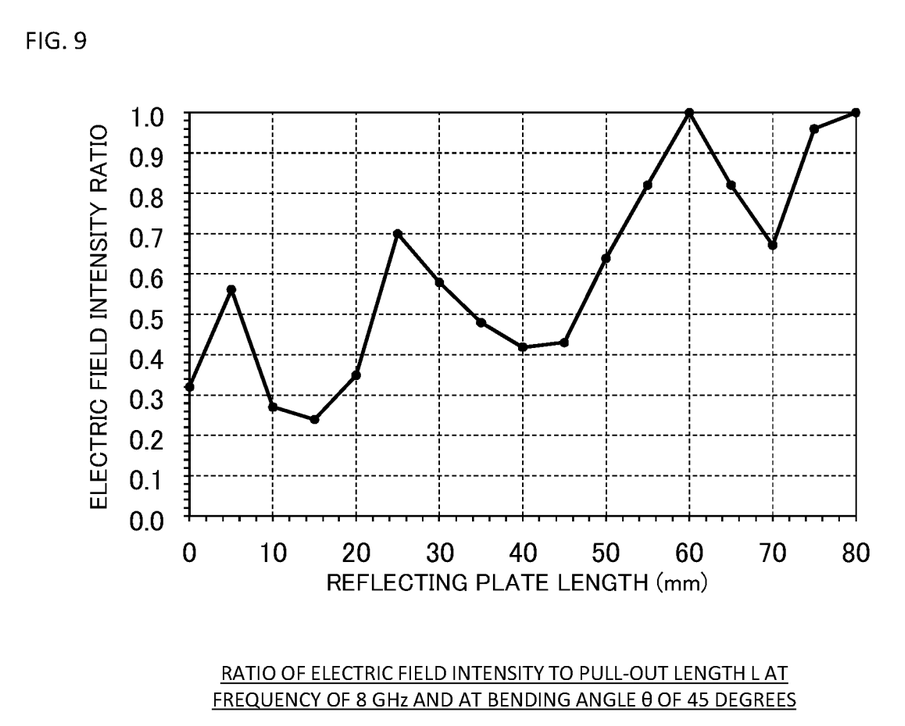
FIG. 9 is a graph plotting changes in electric field intensity ratio observed when a pull-out length is changed from 0 to 80 millimeters (mm) at a bending angle of 45 degrees with electro-magnetic waves emanating at a frequency of 8 GHz in the configuration of the communication device according to the present embodiment.

FIG. 9 is a graph plotting changes in electric field intensity ratio (i.e., the value obtained by dividing the maximum value of radiated power in a radiation angle range from 0 to 22 degrees by the maximum value in all directions) observed when the pull-out length L is changed from 0 to 80 mm at a bending angle θ of 45 degrees with electro-magnetic waves emanating at a frequency of 8 GHz in the configuration of the communication device 30 of the present embodiment. The electric field intensity ratio is given as the value observed at an assumed position for the EMI tests (i.e., the position 10 meters (m) away from the communication device 30). The assumed position is where another product liable to be affected by electro-magnetic waves is assumed to be present (the same applies to the examples hereunder).

As depicted in FIG. 9, particularly within a range from 0 to 50 mm of the pull-out length L, the electro-magnetic interference was confirmed to be suppressed.

Figure 10:
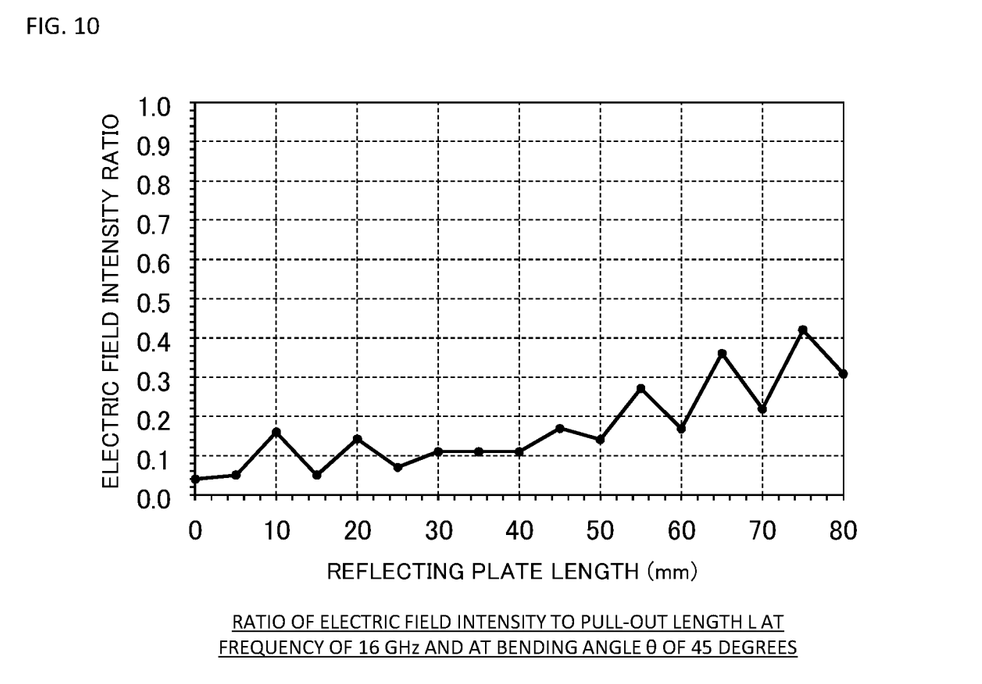
FIG. 10 is a graph plotting changes in electric field intensity ratio observed when the pull-out length is changed from 0 to 80 mm at the bending angle of 45 degrees with electro-magnetic waves emanating at a frequency of 16 GHz in the configuration of the communication device according to the present embodiment.

FIG. 10 is a graph plotting changes in electric field intensity ratio observed when the pull-out length L is changed from 0 to 80 mm at the bending angle θ of 45 degrees with electro-magnetic waves emanating at a frequency of 16 GHz in the configuration of the communication device 30 of the present embodiment.

As depicted in FIG. 10, within a range from 0 to 80 mm of the pull-out length L, the electro-magnetic interference was confirmed to be effectively suppressed. In particular, within a range from 0 to 50 mm of the pull-out length L, the electro-magnetic interference was confirmed to be effectively inhibited.

Figure 11:
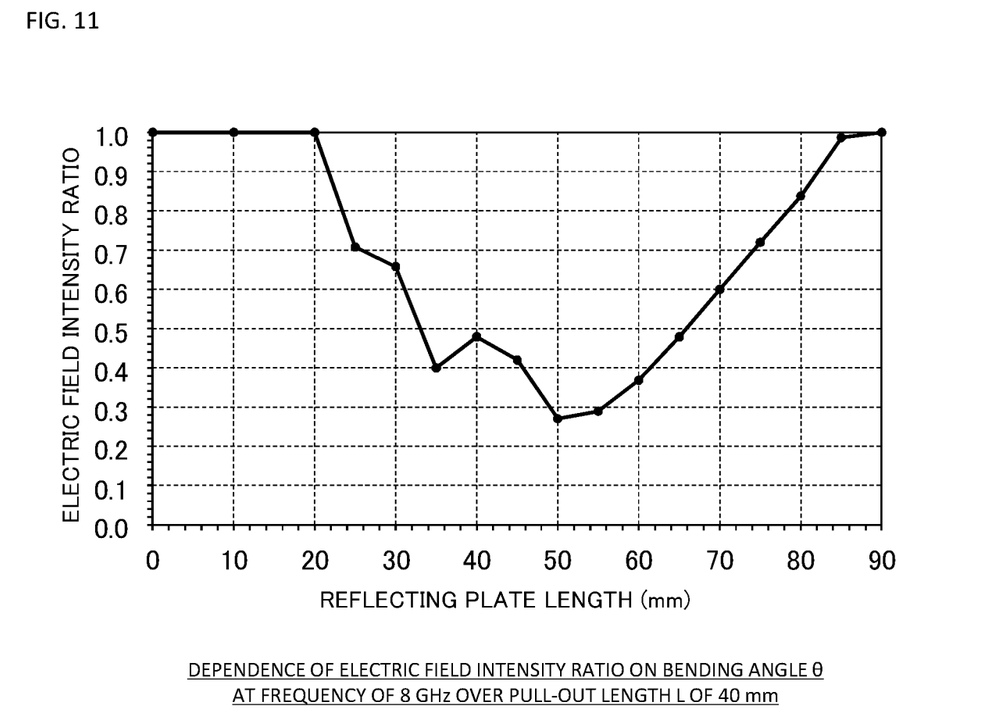
FIG. 11 is a graph plotting changes in electric field intensity ratio observed when the pull-out length is 40 mm and the bending angle is changed from 0 to 90 degrees with electro-magnetic waves emanating at the frequency of 8 GHz in the configuration of the communication device according to the present embodiment.

Next, FIG. 11 is a graph plotting changes in electric field intensity ratio observed when the pull-out length L is 40 mm and the bending angle θ is changed from 0 to 90 degrees with electro-magnetic waves emanating at the frequency of 8 GHz in the configuration of the communication device 30 according to the present embodiment.

As depicted in FIG. 11, in a range from over 20 degrees to 80 degrees of the bending angle θ, the electro-magnetic interference was confirmed to be suppressed.

As described above, the electronic device (communication device 30) of the present embodiment includes the reflecting member 40 having the reflecting surface 41 that causes the electro-magnetic waves emanating in the predetermined radiating direction 5 from the slot surface 31 to be reflected in directions other than the radiating direction 5.

This structure makes it possible to let the electro-magnetic waves coming from the communication device 30 emanate in directions other than the radiating direction 5 (i.e., directivity is shifted). Further, the intensity of the electro-magnetic waves can be expected to be reduced through interference between the electro-magnetic waves reflected by the reflecting surface 41 (reflected waves) on one hand and the electro-magnetic waves emanating directly from the communication device 30 (direct waves not reflected by the reflecting surface 41) on the other hand. It is thus possible effectively to prevent the electro-magnetic waves generated by the communication device 30 from adversely affecting other devices. Further, a very simple process is sufficient for fabricating and attaching the reflecting member 40.

In sum, existing EMI countermeasures have concentrated on containing excess electro-magnetic waves from a source of electro-magnetic wave radiation (i.e., from an electro-magnetic wave radiator). However, it has proved very difficult to contain completely the excess electro-magnetic waves emanating from such sources because the leaked electro-magnetic waves propagate in all directions and are highly likely to adversely affect other devices. Hence, the communication device 30 of the present embodiment is provided with the above-described reflecting member 40 to prevent the adverse effects of electro-magnetic interference on other devices. In the EMI tests, predetermined standards can be met by the reflecting member 40 configured to reflect the electro-magnetic waves toward positions (e.g., elevated positions) away from the position of observation under testing.

In the manner described above, the electronic device (communication device 30) of the present embodiment effectively reduces electro-magnetic interference with other devices.

In addition, the electronic device 30 of the present embodiment includes the pull-out portion 60 allowing the reflecting surface 41 to be separated from the slot surface 31 by a predetermined distance (i.e., pull-out length L).

This structure makes it possible to further promote interference between the reflected waves and the direct waves so as to effectively reduce the electro-magnetic interference with other devices.

The reflecting member 40 of the electronic device 30 according to the present embodiment is configured to include the pull-out portion 60 and the reflecting portion 50, with the pull-out portion 60 extending from the communication device 30 in the radiating direction 5 and the reflecting portion 50 having the reflecting surface 41. The reflecting portion 50 is bent at a predetermined part (boundary edge 33) relative to the pull-out portion 60 in such a manner that the reflecting surface 41 is at a predetermined angle (bending angle θ) to the direction of extension of the pull-out portion 60.

This structure allows the electro-magnetic waves from the communication device 30 to be reflected by the reflecting surface 41 in a desired direction, thereby effectively reducing electro-magnetic interference.

Further, in the communication device 30 of the present embodiment, the pull-out length L is set to be 50 mm or less.

This structure allows the electro-magnetic waves from the communication device 30 to be effectively reflected in other directions, thereby reducing the electro-magnetic interference effectively.

The communication device 30 of the present embodiment further includes the cable insertion port 35 into which the communication cable 90 can be inserted. The communication device 30 also has the reflecting member 40 provided with the cutaway portion 80 in which the communication cable 90 is positioned upon insertion into the cable insertion port 35.

This structure allows the communication cable 90 to be easily inserted into and detached from the cable insertion port 35. The structure further prevents the communication cable 90 inserted in the cable insertion port 35 from being bent in a space near the reflecting portion 50 (so that the communication cable 90 extends in a substantially horizontal direction).

The reflecting portion 50 of the communication device 30 of the present embodiment is bent relative to the pull-out portion 60 in such a manner that the reflecting surface 41 is at an angle greater than 20 degrees and up to 80 degrees with respect to the direction of extension of the pull-out portion 60.

This structure allows the electro-magnetic waves from the communication device 30 to be reflected effectively by the reflecting surface 41 in other directions, thereby reducing the electro-magnetic interference.

The reflecting surface 41 of the reflecting member 40 of the communication device 30 according to the present embodiment is formed of a metallic member.

This structure allows the electro-magnetic waves from the communication device 30 to be reliably reflected by the reflecting surface 41, thereby reducing the electro-magnetic interference effectively.

The communication device 30 of the present embodiment also includes the attachment/detachment structure 70 that allows the reflecting member 40 to be attached and detached.

This structure permits flexible design of the communication device 30 and of the reflecting member 40.

The reflecting member 40 of the communication device 30 of the present embodiment is a substantially planar member connected to the communication device 30, the reflecting member 40 having the reflecting surface 41 that causes the electro-magnetic waves emanating from the slot surface 31 in the radiating direction 5 to be reflected in directions other than the radiating direction 5.

In this simply formed structure, the reflecting surface 41 causes the electro-magnetic waves from the communication device 30 to be reflected in directions other than the radiating direction 5, thereby reducing the electro-magnetic interference effectively.

The present invention is not limited to the preferred embodiment discussed above and may be implemented in diverse variations using desired components so far as such variations are within the scope of the present invention. The embodiment and variations thereof described above is merely an example, and its specifics are not limitative of the present invention as long as the features of the invention are not impaired. Other modes and modifications that may be conceived within the scope of the technical idea of the present invention also fall within the scope thereof.

For example, whereas there is the bent part between the reflecting portion 50 and the pull-out portion 60 in the above-described embodiment, alternatively the boundary part between the reflecting portion 50 and the pull-out portion 60 may be machined into a curved surface.

Whereas the reflecting member 40 in the above embodiment can be attached to and detached from the communication device 30 via the attachment/detachment structure 70, alternatively the communication device 30 and the reflecting member 40 may be integrated into a single unit. In the reflecting member 40, the reflecting portion 50 and the pull-out portion 60 may be configured as separate members or may be integrated into a single unit.

Whereas the reflecting portion 50 (reflecting surface 41) in the above embodiment is bent upward so as to reflect the electro-magnetic waves in the upward direction, alternatively the reflecting portion 50 may be structured to reflect the electro-magnetic waves downward. In this case, the pull-out portion 60 is provided, for example, to extend in a substantially horizontal direction from a boundary edge (top edge) between the slot surface 31 and a top surface of the communication device 30. The reflecting portion 50 is provided at the boundary edge 61 with the pull-out portion 60 in such a manner as to be bent downward at a predetermined angle relative to the surface direction (substantially horizontal direction) of the pull-out portion 60.

Whereas the above embodiment has been described as an example of application of the present invention to the communication device 30, this is not limitative of the present invention. The invention may be applied to all electronic devices that radiate electro-magnetic waves. For example, in a server equipment, extension cards are connected to the main substrate via Peripheral Component Interconnect (PCI) slots. These cards generate high-frequency electro-magnetic waves in keeping with ever-higher data transmission rates. When equipped with the reflecting member of the present invention against the electro-magnetic waves emitted from the PCI slots, the extension cards benefit from advantages similar to those of the above-described embodiment.

What is claimed is:

1. An electronic device comprising:
    an insertion port into which a communication cable can be inserted; and
    a reflecting member that includes:
        a reflecting surface that causes electro-magnetic waves emanating from a predetermined part of the electronic device in a predetermined radiating direction to be reflected in a direction other than the radiating direction, and
        a cutaway portion cut away that is configured to receive the communication cable when the communication cable is inserted into the insertion port.
2. The electronic device according to claim 1, wherein the reflecting member has a pull-out portion that separates the reflecting surface from the predetermined part of the electronic device by a predetermined distance.
3. The electronic device according to claim 2, wherein the reflecting member is configured to include the pull-out portion extending from the electronic device in the radiating direction and a reflecting portion having the reflecting surface, the reflecting portion being bent at a predetermined part relative to the pull-out portion in such a manner that the reflecting surface is at a predetermined angle relative to a direction of extension of the pull-out portion.
4. The electronic device according to claim 3, wherein a distance from the predetermined part to the bent part is 50 millimeters or less.
5. The electronic device according to claim 3, wherein the reflecting portion is bent relative to the pull-out portion in such a manner that the reflecting surface is at an angle greater than 20 degrees and up to 80 degrees relative to the direction of extension of the pull-out portion.
6. The electronic device according to claim 1, wherein the reflecting surface of the reflecting member is formed of a metallic member.
7. The electronic device according to claim 1, wherein the reflecting member is a substantially planar member connected to the electronic device,
    the reflecting member having the reflecting surface that causes the electro-magnetic waves emanating from the predetermined part in the radiating direction to be reflected in a direction other than the radiating direction.
8. An electro-magnetic interference reduction method, the electro-magnetic interference reduction method comprising:
    furnishing the electronic device of claim 1.
9. An electronic device comprising:
    a reflecting member that includes a reflecting surface that causes electro-magnetic waves emanating from a predetermined part of the electronic device in a predetermined radiating direction to be reflected in a direction other than the radiating direction; and
    an attachment/detachment structure configured to permit attachment and detachment of the reflecting member.
10. The electronic device according to claim 9, wherein
    the electronic device has an insertion port into which a communication cable can be inserted, and
    the reflecting member has a cutaway portion cut away therefrom in such a manner that is configured to receive the communication cable when the communication cable is inserted into the insertion port.
11. An electro-magnetic interference reduction method, the electro-magnetic interference reduction method comprising:
    furnishing the electronic device of claim 9.
12. The electronic device according to claim 9, wherein the reflecting member has a pull-out portion that separates the reflecting surface from the predetermined part of the electronic device by a predetermined distance.
13. The electronic device according to claim 12, wherein the reflecting member is configured to include the pull-out portion extending from the electronic device in the radiating direction and a reflecting portion having the reflecting surface, the reflecting portion being bent at a predetermined part relative to the pull-out portion in such a manner that the reflecting surface is at a predetermined angle relative to a direction of extension of the pull-out portion.
14. The electronic device according to claim 13, wherein a distance from the predetermined part to the bent part is 50 millimeters or less.
15. The electronic device according to claim 13, wherein the reflecting portion is bent relative to the pull-out portion in such a manner that the reflecting surface is at an angle greater than 20 degrees and up to 80 degrees relative to the direction of extension of the pull-out portion.

16. The electronic device according to claim 9, wherein the reflecting surface of the reflecting member is formed of a metallic member.

* * * * *